US006769923B2

United States Patent
Caldwell

(12) United States Patent
(10) Patent No.: US 6,769,923 B2
(45) Date of Patent: Aug. 3, 2004

(54) FLUTED SIGNAL PIN, CAP, MEMBRANE, AND STANCHION FOR A BALL GRID ARRAY

(75) Inventor: Barry Caldwell, Hesston, KS (US)

(73) Assignee: LSI Logic Corporation, Milpitas, CA (US)

( * ) Notice: Subject to any disclaimer, the term of this patent is extended or adjusted under 35 U.S.C. 154(b) by 50 days.

(21) Appl. No.: 10/024,054

(22) Filed: Dec. 17, 2001

(65) Prior Publication Data

US 2003/0114026 A1 Jun. 19, 2003

(51) Int. Cl.[7] ............................................. H01R 12/00
(52) U.S. Cl. ............................ 439/74; 439/78; 439/71; 439/83
(58) Field of Search ............................ 439/66, 75, 74, 439/82, 83, 78, 71

(56) References Cited

U.S. PATENT DOCUMENTS

| | | | | |
|---|---|---|---|---|
| 3,917,374 A | * | 11/1975 | Murdock | 439/184 |
| 4,927,372 A | * | 5/1990 | Collier | 439/83 |
| 5,127,837 A | * | 7/1992 | Shah et al. | 439/71 |
| 5,205,741 A | * | 4/1993 | Steen et al. | 439/73 |
| 5,451,174 A | * | 9/1995 | Bogursky et al. | 439/83 |
| 5,967,850 A | * | 10/1999 | Crane, Jr. | 439/660 |
| 6,083,013 A | * | 7/2000 | Yamagishi | 439/71 |
| 6,220,870 B1 | * | 4/2001 | Barabi et al. | 439/71 |
| 6,224,399 B1 | * | 5/2001 | Yacoub | 439/83 |
| 6,551,112 B1 | * | 4/2003 | Li et al. | 439/71 |

* cited by examiner

Primary Examiner—P. Austin Bradley
Assistant Examiner—Briggitte R. Hammond
(74) Attorney, Agent, or Firm—Suiter West PC LLO

(57) ABSTRACT

A fluted signal pin provides expanded surface area for high frequency operation which minimizes inductive and capacitive effects. The signal pin may be mounted to a circuit board via a support stanchion or membrane during assembly or repair. The membrane may be permanent or removable by heat, water, and/ or detergent. A pin cap optionally is provided to ensure attachment to an overlying integrated circuit package.

28 Claims, 8 Drawing Sheets

FLUTED SIGNAL PIN, CAP, MEMBRANE, AND STANCHION FOR A BALL GRID ARRAY

FIELD OF THE INVENTION

The present invention generally relates to the field of connectors, and particularly to signal pins designed for high frequency operation and their supporting structures in making an electrical connection between a grid array package and the board or substrate to which it mates.

BACKGROUND OF THE INVENTION

Miniaturization is a long term trend in electronics that has affected all component parts in electronics, including connectors. Connectors have been developed so as to reduce the pitch between terminals. In affixing an integrated circuit (IC) to a circuit board or substrate, ball grid arrays are often used. In a BGA package, spherical solder balls are positioned on electrical contact pads of a circuit substrate by an adhesive means such as solder melt. There is a need to shorten the signal length path on ball grid array (BGA) and pin ball grid array (PBGA) type packages for high speed chips of either digital or analog technology. A PBGA is a BGA using wire signal pins in place of solder balls.

Reliance on solder balls in BGA presents certain problems. Solder balls need to be very uniform in size so that all contact points are made and mechanical stress on the BGA package is minimized. Variations in size and shape may result in variations in electrical performance. Solder balls also represent a minimal surface area. As circuitry becomes faster, this becomes an impediment because currents tend to become concentrated at low skin depths of the conductor. To maximize current flow at high frequencies, it is important to maximize the cross section area having a limited skin depth so as to maximize current flow.

The inductance and capacitance of current ball grid array solder balls needs to be lowered to allow lower edge rate transitions and give a more controlled method of signal path impedance.

With the trends toward miniaturization and higher speed signal transmission, problems such as loss of transmitted signals, interference between signals or crosstalk and interference from extraneous signals occur along the signal path. Each electrical conductor acts as a transmission line having a certain characteristic impedance determined by its resistance, inductance, and distributed capacitance. At high frequency operation, reflections, resonances and standing wave phenomena may appear when there is a significant difference in the magnitudes of the characteristic impedances of the circuits connected to the signal path.

One solution to improving high frequency signal transmission for integrated circuits has been to dedicate certain pins for making ground connections. In certain cases, each signal pin used may have an associated adjacent pin used for a ground connection to minimize cross-talk problems. Substantial impedances may still exist in the ground connections and a greater number of connector pins are needed making this less than an optimal solution.

Crosstalk between signal paths increases with frequency and reduced spacing between signal contacts. When several bus lines are forced to share power and/or ground pins, their current loops overlap. These overlapping current loops form a single-turn, loosely coupled transformer with multiple inputs and outputs. Any signal on one loop couples, through the transformer effect, onto all the others.

Parasitic capacitances may form between conductors separated by a dielectric material. Capacitance is measured by their relative ability, compared to a vacuum, to store energy, and is expressed in terms of a dielectric constant, with the value for a vacuum taken as unity. The dielectric constant, also called permittivity or relative dielectric constant $\epsilon_r$, is a measure of the ratio of the speed of an electromagnetic signal in free space to the speed of the signal in a material. The values of dielectric constant range from slightly more than 1 (since everything known in our universe travels at a speed of less than the speed of light in a vacuum) up to 100 or more.

As pins become smaller, their placement needs to be more delicate and precise. Current methods employing solder balls do not have the same need for delicate, precise placement. It is necessary for pin technology to align and stabilize the pins in a 3D array to the grid and PCB on which the chip will be mounted. The need concerns assembly as well as repair.

Therefore, it would be desirable to provide a signal pin which offers low inductance and low capacitance effects for high speed operation in which the pin is mounted in a support which provides stability, spacing, rigidity, flexibility, and durability.

SUMMARY OF THE INVENTION

Accordingly, the present invention is directed to a fluted signal pin and its support structures.

In a first aspect of the present invention, a signal transmitting member for integrated circuit package has a central elongated body and at least one flute which extends from the central elongated body. The flute provides greater surface area to effectively decrease the resistance of the signal transmitting member at high frequency operation. Fluting also offers reduced signal pin inductance and capacitance with improved manufacturing process capabilities. The fluted surface of the pin increases the high frequency skin surface conduction area by lowering the inductance and capacitance. The decreased overall pin diameter and pin-to-pin spacing as compared to a standard solder ball lowers the pin-to-pin capacitance. This allows high frequency, reduced signal edge rate, digital signals or improved high frequency analog signal performance.

In a second aspect of the present invention, a support member for holding signal pins between an integrated circuit package and a circuit board or substrate has a main body made of an insulating material and holes in the main body for allowing passage of the signal pins. The support member may be a membrane to hold signal pins in a precise array that will allow an automated or manual attachment of signal pins to BGA or PBGA (pin ball grid array) packages. The support member may be a cylindrical braced pin array which allows the construction of PBGA packaging with wired signal pins for signal conduction and connection between BGA/chip substrate and circuit board.

In a third aspect of the present invention, there is a circuit structure. In the circuit structure are an integrated circuit package such as a pin ball grid array or ball grid array package, signal pins, and a circuit board or substrate. In the circuit structure, either the signal pin is supported by a support member or the signal pin is fluted.

In a fourth aspect of the present invention, a signal transmitting pin between an integrated circuit package and a circuit board substrate is shaped so as to present an increase in surface area over a purely cylindrical or tapered cylindrical shape so as to minimize inductive and capacitive effects at high frequency operation.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring generally now to FIGS. 1 through 10C, exemplary embodiments of the present invention are shown.

As signal frequencies are increased, the signal tends to be concentrated in a thinner layer at the surface of the conductor. This skin effect increases the effective resistance of the conductor. Skin depth is a measure of the depth below the surface of the conductor at which current density has decreased about 8.7 decibels or 1 neper below the current density at the surface.

Because increased signal speed entails increased effective resistance in the transmitting conductor as well as increased inductance and capacitance, it becomes important to look for ways to maximize the surface area along the length of a conductor which carries the signal. The present invention introduces such a technique by altering the cross sectional shape of a signal pin.

Figure 1:
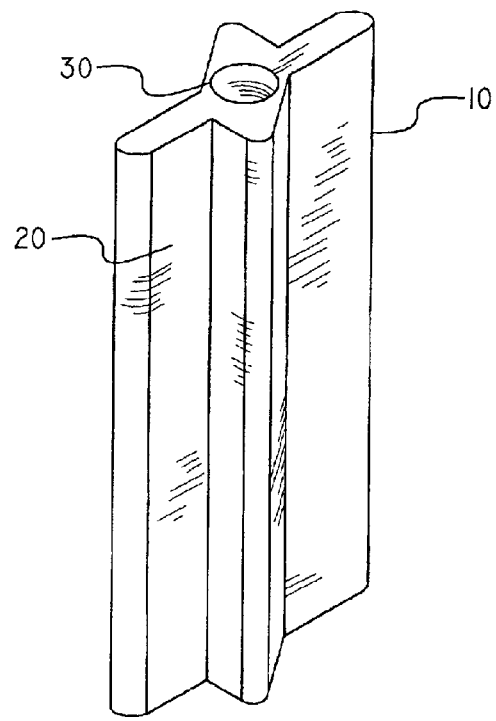
FIG. 1 illustrates a fluted pin of a first embodiment.

FIG. 1 illustrates a fluted signal pin 10 of a first embodiment. The fluted signal pin may have one or more flutes 20 to increase surface area for increased high frequency signal conduction on the skin surface under skin effect signal conditions. The pin diameter is of a diameter to effectively attach to a PCB land or solder pad as specified by international printed circuit (IPC) standards for BGA land patterns or any new standard that would address this improvement in attachment method.

The signal pin may be formed of any material of sufficient conductivity, rigidity, flexibility, and durability that is compatible with printed circuit board and chip package materials and processes. Some examples are beryllium copper alloy, copper steel alloy, brass, copper, gold, aluminum, nickel, silver, steel, titanium, or tungsten.

The pin may be produced as an extruded fluted wire product with the ends shaped during the extrusion process at the cut length stage. The signal pin may also be a standard round wire or a tapered pin. A conductive wire may be milled into a series of opposed sections, perhaps have a taper or other form, which spaced from each other and severed to form the pins. Coining or molding the pins may also be done. The pins may also be formed at a pin blank rolling station by cold rolling the end portions of cylindrical pin blanks severed from a length of conductive wire.

The pin may later be encased in an electrically nonconductive material that can be molded or shaped into a cylindrical shape. The signal pin may be positioned through the center of the cylinder with a conductive contact protruding from each end of the cylinder.

Figure 2:
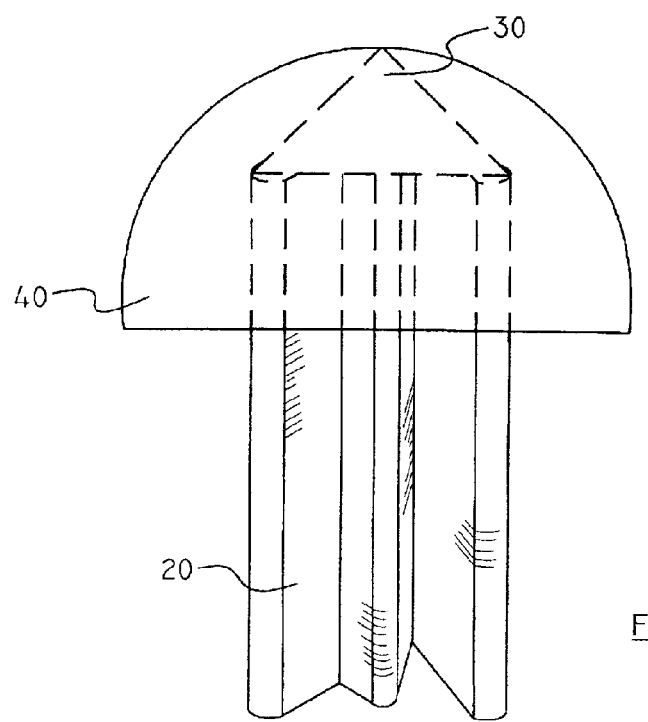
FIG. 2 illustrates a fluted pin, of a second embodiment with a hemispherical pin cap.
Figure 13:
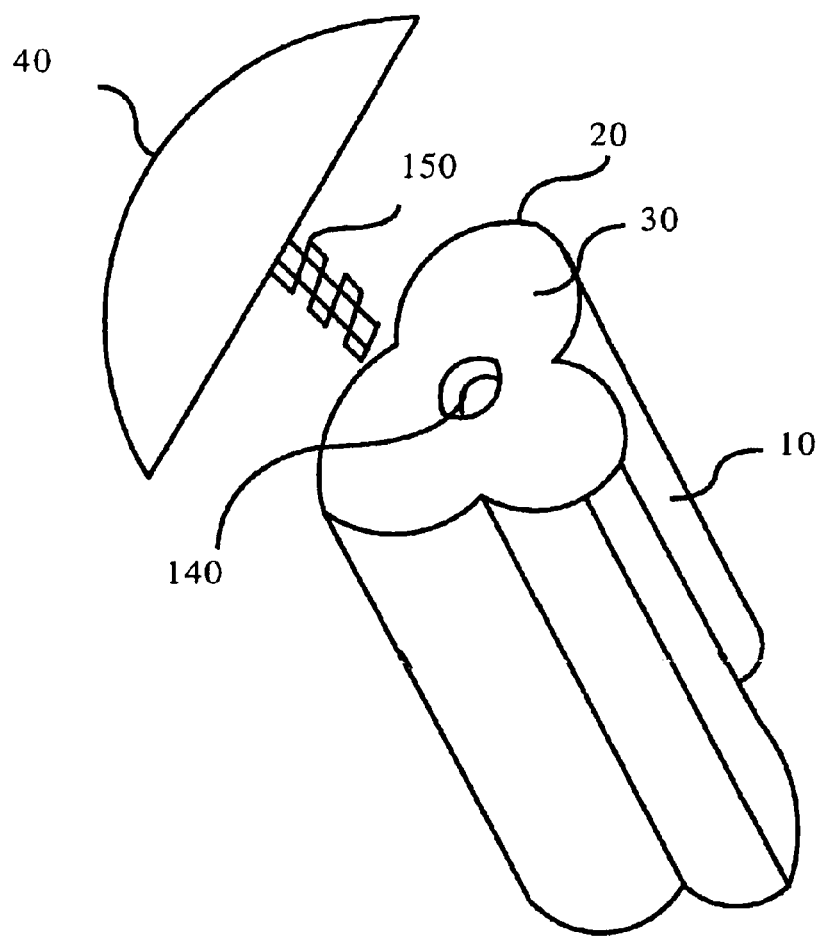
FIG. 13 illustrates a signal pin with a screwed on cap of the present invention.

FIG. 2 illustrates a fluted pin of a second embodiment with a hemispherical pin cap (HPC) 40 and a triangular cross section 30. Cross sections such as oval, circular, square, polygonal, and other shapes may alternatively be employed. The HPC 40 pin cap may have a maximum height approximately equal to ⅓ the diameter of a sphere based on a standardized solder ball used on BGA packages. The HPC 40 may be made of a material having a relative dielectric constant $\epsilon_r$ as close to 1 as possible. It may also be made of a high dielectric constant material. The material should have a high melt temperature. It also should have a deformation coefficient to allow the fluted pin to be inserted through it or to be molded onto or around the fluted pin. The FIPC material, in another embodiment, may be metallic. For example, it may be made from solder ball materials. The HPC may be formed around the pin or have a hole through the radial axis through which the pin could be inserted in a displacement fit. For instance, it could be screwed onto the end of the signal pin 10, as illustrated in FIG. 13. In FIG. 13, the HPC screws (via screw 150) into a hole 140 of the signal pin 10.

The pin may stick up above the curved surface HPC ⅒ of the diameter of a standard solder ball or be flush with the curved surface.

Problems may be encountered in placing the pins on the circuit board substrate. The pins may bend easily because of their thinness. The pins may also be hard to align.

An integrated circuit package such as a PBGA may need a stability array to maintain vertical, horizontal position and pin orientation. The array may be extended to cover the whole PBGA. The wire signal pins are attached to the conductive solder land pads on the bottom of the BGA substrate with either metallic solder attachment or conductive adhesive attachment.

Figure 3:
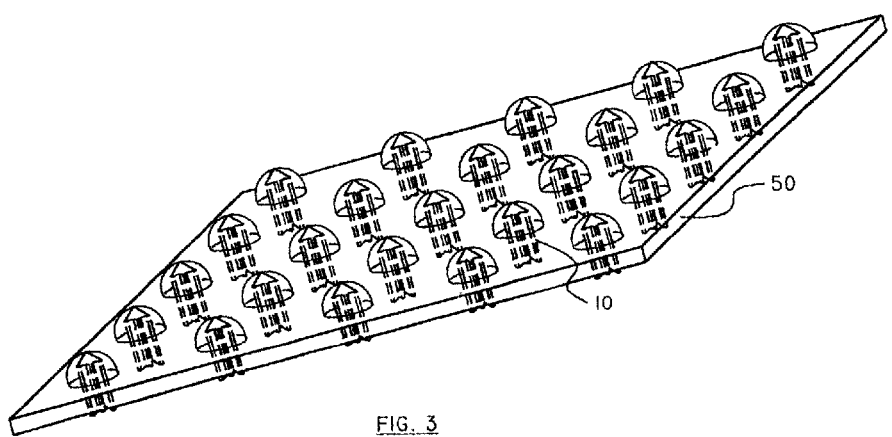
FIG. 3 illustrates an array of fluted pins mounted in a support membrane in a perspective view.
Figure 4:
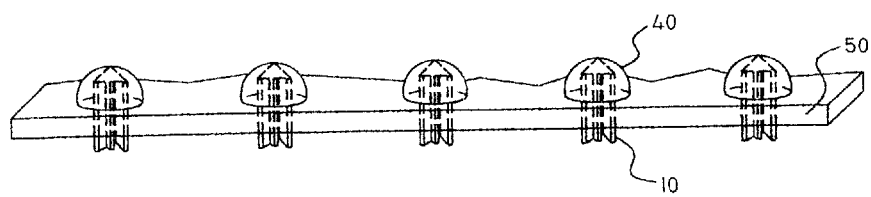
FIG. 4 illustrates a cross section of an array of fluted pins mounted in a support membrane.
Figure 11:
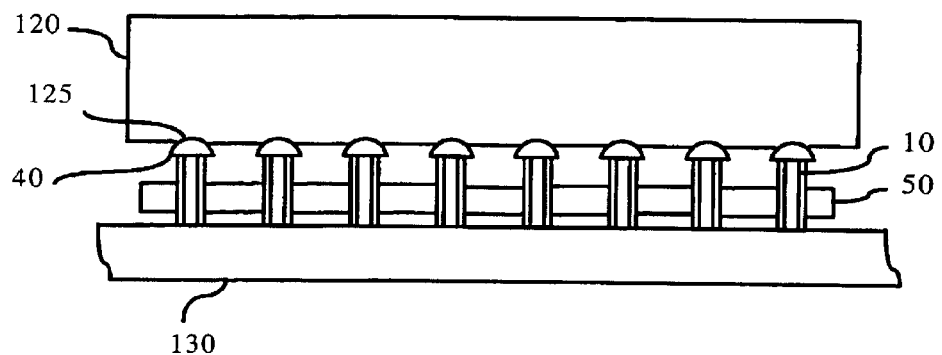
FIG. 11 illustrates a cutaway view of a circuit structure with membrane of the present invention.

As shown in FIGS. 3 and 4, a first supporting structure is a membrane 50 to hold signal pins in a precise array that will allow an automated or manual attachment of signal pins to BGA or PBGA (pin ball grid array) packages. The supporting structure holds signal pins for mass production attachment to BGA and PBGA packages 120 without interacting with signal transmission parameter and degrading them, as shown in FIG. 11. In FIG. 11, recesses 125 on the underside of the integrated circuit package 120 facilitate attachment of the HPC 40 of signal pin 10. The signal pins 10 electrically connect the integrated circuit package 120 with a circuit board 130. The membrane allows high volume attachment production of signal pins onto either BGA or PBGA type packages. The membrane allows automated signal pin replacement with automated repair equipment.

The membrane 50 may be either a non-dissolving type or a dissolving membrane. The dissolving membrane allows individual rework of a single HPC that has been damaged. It may be an organic based plastic which is washed away with water or disappears with the application of heat. It may also be removed with detergents. It may further be a cellulose material which dissolves with heat. The non-dissolving type membrane has a more elaborate rework methodology. The choice of materials is not meant to be limited by these examples, but the material of the membrane must have suitable compatibility with the materials of the BGA/ chip package, signal pins, and PCB as well as sufficient stability and aligning ability. The membrane may have a thickness and membrane material based on HPC length, fluted pin diameter, and rework methodology. The longer the fluted pin, the thicker the membrane.

FIG. 3 illustrates an array of fluted pins 10 mounted in a support membrane in a perspective view. The HPC 40 provides the pin end that attaches to the BGA/ chip package substrate with an end that resembles a solder ball surface so that the current solder ball attachment technology may be used for placing individual or multiple HPCs to attach the pin 10 to the recess formed in the BGA/ chip package. Other methods of attaching or placing the HPCs may be used.

In one embodiment, the HPCs are inserted through a non-conductive thermal plastic membrane made from high temperature materials. The flat side of the cap of the HPCs rests on the one surface of the membrane. In most instances, there is an adhesive action between the cap flat and the membrane surface. This may be provided by an adhesive melt such as solder applied to the recess on the BGA/ chip package where the HPC mates. The insertion point of the HPC fluted pin through the membrane is a displacement fit having a negative tolerance.

FIG. 4 illustrates a cross section of an array of fluted pins mounted in a support membrane. The HPCs 40 prevent passage of the signal pin 10 through the membrane 50.

Figure 5:
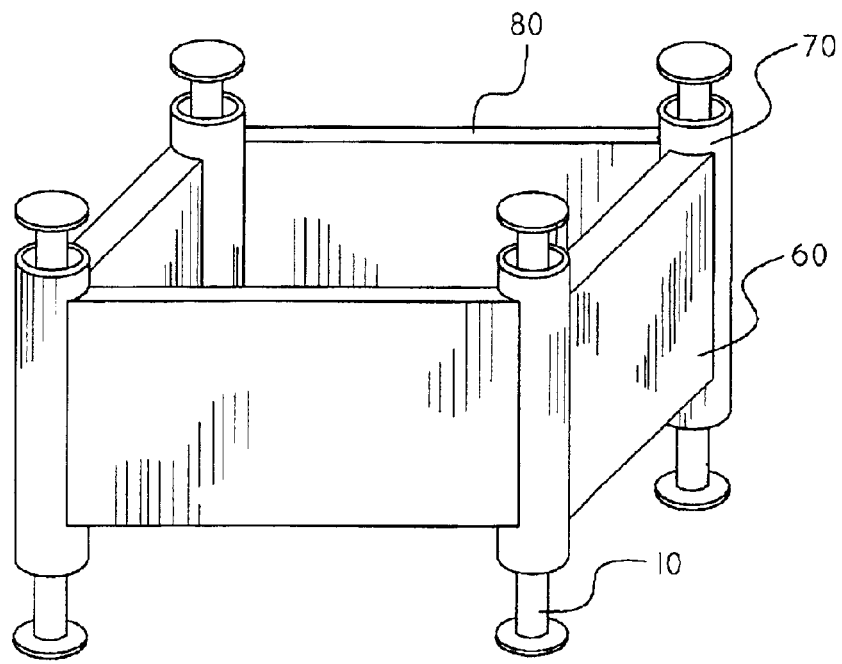
FIG. 5 illustrates a four pin support stanchion.
Figure 6:
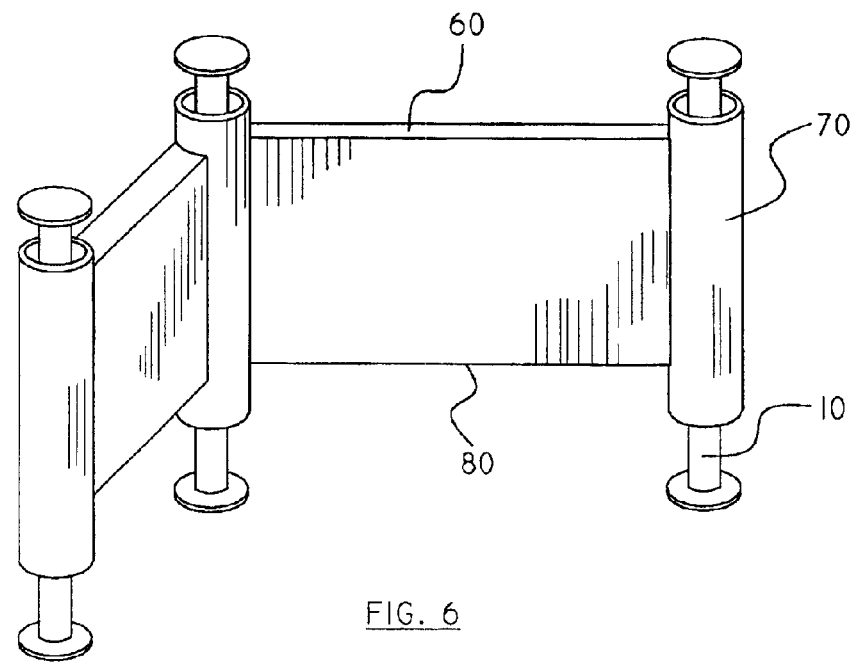
FIG. 6 illustrates a three pin support stanchion.
Figure 7:
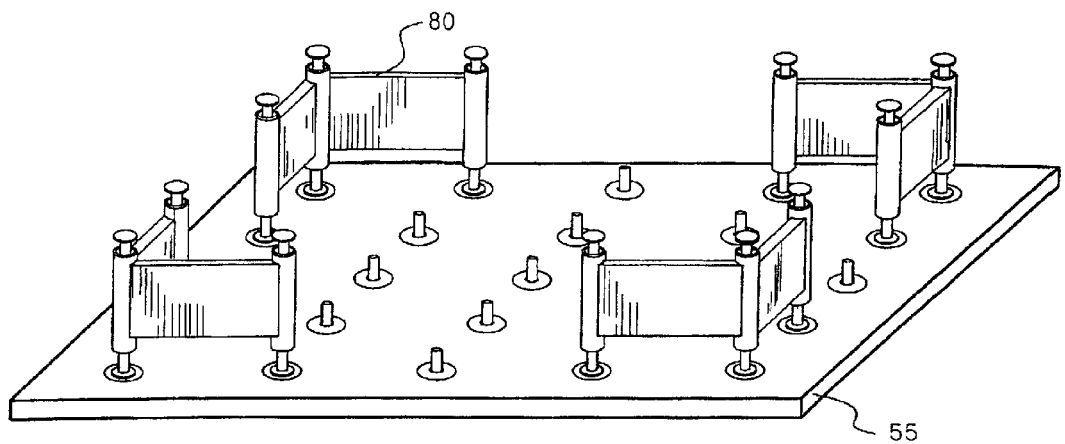
FIG. 7 illustrates four three pin support stanchions placed on a circuit board or substrate.
Figure 8:
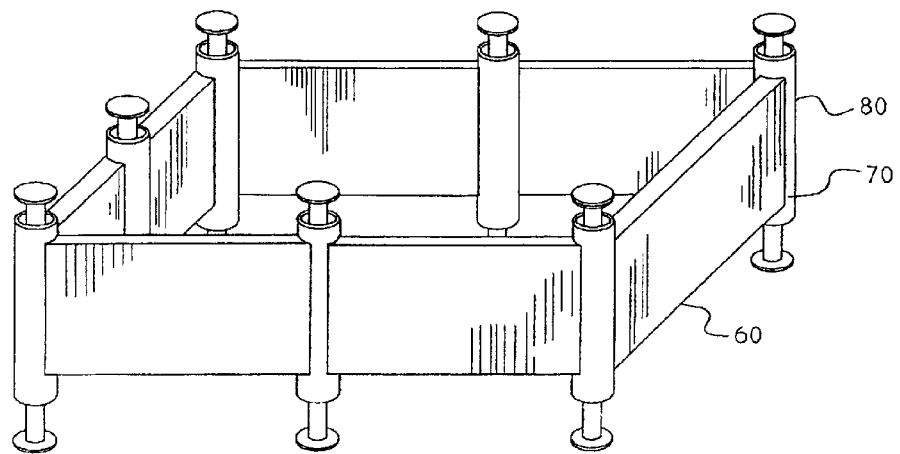
FIG. 8 illustrates a seven pin enclosed stanchion.
Figure 12:
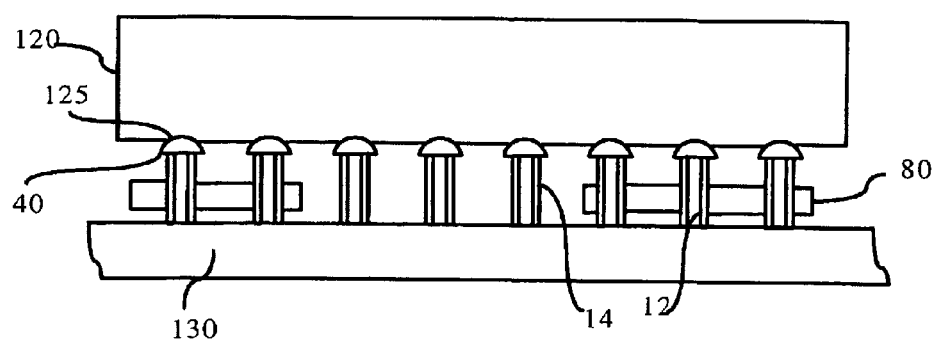
FIG. 12 illustrates a cutaway view of a circuit structure with stanchions of the present invention.
Figure 14:
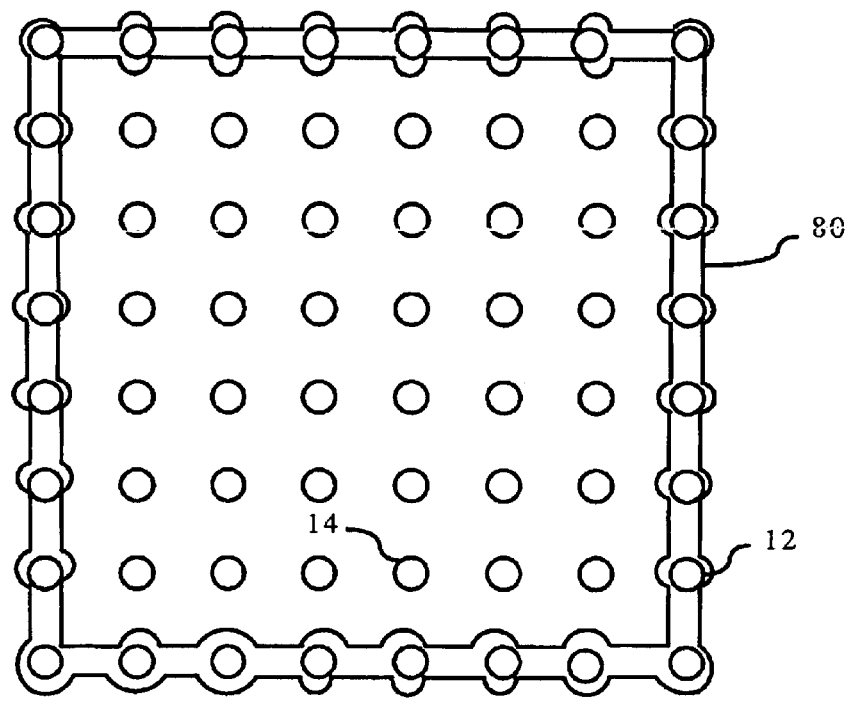
FIG. 14 illustrates an embodiment in which the support member entirely encloses an area of unattached signal pins.

As shown in FIGS. 5–8, 12, and 14, a second supporting structure is a multipin stanchion. In a multipin stanchion, a cylindrical braced pin array allows the construction of PBGA packaging with wired signal pins for signal conduction and connection between BGA/ chip substrate and circuit board. The stanchion holds wire signal pins in a vertical and horizontal stable position for mass production attachment of PBGA packages to circuit board. A minimum of three cylinders are attached together to form at a minimum one right angle pin array. The cylinders and the interconnecting braces are of sufficient material thickness to provide a rigid structure that when placed between a PBGA (pin ball grid array) substrate and the PCB will hold the PBGA in a stable position during the pin attach solder process for PBGA to PCB lands. FIG. 5 shows a four pin support stanchion 80. The stanchion may be an array of side by side pins or span one or more pad lands. Pin supports 70 are formed at right angle intersections of support walls 60. FIG. 6 illustrates a three pin support stanchion 80. In normal practice, four of a like kind array, either 3 or 4 position, may be placed at equal distance points on a PBGA to maintain its vertical stability during attachment to a PCB. Two would be the minimum needed for a 3 pin stanchion. One for 4 or more pin stanchions. A two pin stanchion may be used in certain applications. Many other materials may be used for the PCB beside FR4, such as flex circuit kapton. Surface mount devices (SMD) and through hole (TH) components may be attached with high temperature solder reflow processes or with electrically conductive adhesives. FIG. 7 illustrates four three pin support stanchions 80 placed on a circuit board or substrate 55. The stanchions 80 are placed at the corners of the location where the integrated circuit package will be set down. The bottom ends of the pins are placed on the circuit board pads that normally receive the solder balls of a BGA/ chip package. Interior pins may be placed free of any stanchion or other support. FIG. 8 illustrates a seven pin enclosed stanchion. This would form the resting place for an integrated circuit package. FIG. 12 shows a cutaway view of a BGA/ chip package 120 having recesses 125 that receive the HPC 40 of a signal pin 12, 14 that electrically connects to a circuit board 130. In FIG. 12, a portion of the signal pins 12 are supported by stanchions 80 and a portion of the signal pins 14 are unsupported. FIG. 14 shows an array of signal pins 12, 14, in which a stanchion 80 entirely encloses an area of unsupported signal pins 14.

Figure 9A:
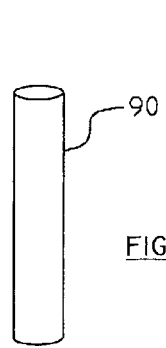
FIGS. 9A, 9B, and 9C illustrate cylindrical pins.
Figure 9B:
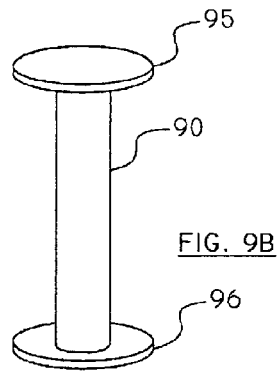
Figure 9D:
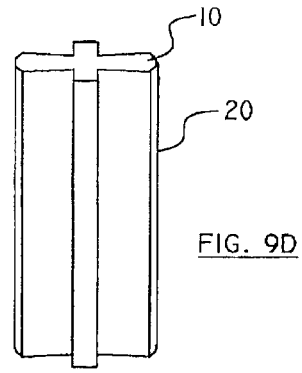
FIGS. 9D and 9E illustrate a fluted pin.
Figure 9C:
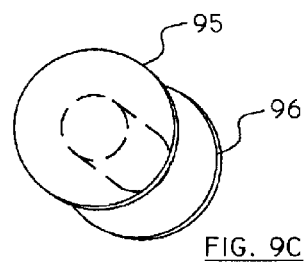
Figure 9E:
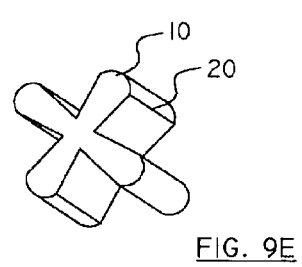

As shown in FIGS. 9A to 9E, a variety of pin types may be used with the support structures such as the membrane or the stanchion. In FIG. 9A, the signal pin may be a cylindrical pin 90 with a smooth even surface. In FIGS. 9B and 9C, the pin ends 95 may either be blunt or shaped with either a conical or bulb form on the end attached to the chip package substrate. The pin end would be either blunt, V or indented cone shaped, for the end that would attach to the PCB. In FIGS. 9D and 9E, a fluted pin 10 may be held by the support structure. In FIG. 9E, the flute grows thicker the farther it is from the center of the pin.

Figure 10A:
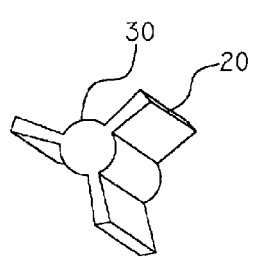
FIGS. 10A, 10B, and 10C, illustrate cross sections of three variations of fluted pins.
Figure 10B:
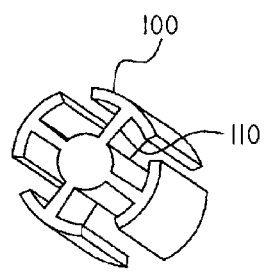
Figure 10C:
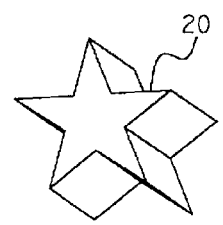

As shown in FIGS. 10A to 10C, the fluted signal pins mounted in the support structures have various cross sectional shapes. FIG. 10A shows a fluted pin in which the flute 20 maintains a set thickness as it extends from the signal pin's central body 30. FIG. 10B shows a configuration of the fluted pin in which the thickness of the flute 110, 100 increases away from the signal pin's longitudinal axis. FIG. 10C shows a fluted pin in which the flutes 20 taper as they extend away from the signal pin's longitudinal axis. Any cross sectional shape may be used as long as it increases the surface area of the pin along the pin's entire length between its mount points to the BGA/ chip package and circuit board substrate.

It is believed that the fluted signal pin, cap, membrane, and stanchion for a ball grid array of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A circuit structure, comprising:
   an integrated circuit package;
   at least one signal pin;
   a circuit board; and
   a support member for supporting the at least one signal pin, the at least one signal pin and the support member being disposed between the integrated circuit package and the circuit board, the at least one signal pin electrically and physically interconnecting the circuit board and the integrated circuit package, wherein the support member is a two or more pin stanchion, the stanchion being a vertically oriented member of insulating material which has holes allowing the passage of the at least one signal pin in a vertical orientation with respect to a plane of major extension of the circuit board, the support member being placed only at the corners of the integrated circuit package.

2. The circuit structure of claim 1, wherein the support member entirely encloses an area.

3. The circuit structure of claim 1, wherein the support member is a layer of insulating material oriented parallel to the plane of major extension of the circuit board, the support member having holes for allowing the passage of the signal pins.

4. The circuit structure of claim 3, wherein the support member forms a permanent part of the circuit structure.

5. The circuit structure of claim 3, the support member is capable of being washed away with water.

6. The circuit structure of claim 1, wherein the at least one signal pin is cylindrical and is non-fluted.

7. The circuit structure of claim wherein the at least one signal pin is fluted.

8. The circuit structure of claim 7, the at least one signal pin comprising a cap at one end.

9. The circuit structure of claim 8, wherein the cap has a maximum height approximately equal to one third of the diameter of a standardized solder ball useable to connect the integrated circuit package to the circuit board.

10. The circuit structure of claim 1, wherein the at least one signal pin is fluted and is supported by the support member.

11. The circuit structure of claim 1, wherein the integrated circuit package is a ball grid array package.

12. The circuit structure of claim 1, wherein the integrated circuit package is a pin ball grid array package.

13. The circuit structure of claim 1, wherein the at least one signal pin is attached to the integrated circuit package with metallic solder.

14. The circuit structure of claim 1, wherein the at least one signal pin is attached to the integrated circuit package with conductive adhesive.

15. A circuit structure, comprising:
an integrated circuit package;
at least one signal pin;
a circuit board; and
a support member for supporting the at least one signal pin, the at least one signal pin and the support member being disposed between the integrated circuit package and the circuit board, the at least one signal pin electrically and physically interconnecting the circuit board and the integrated circuit package, wherein the support member entirely encloses an area, a signal pin being unsupported by a stanchion in the area enclosed by the support member.

16. A circuit structure, comprising:
an integrated circuit package;
at least one signal pin;
a circuit board; and
a support member for supporting the at least one signal pin, the at least one signal pin and the support member being disposed between the integrated circuit package and the circuit board, the at least one signal pin electrically and physically interconnecting the circuit board and the integrated circuit package, wherein the support member is a layer of insulating material oriented parallel to the plane of major extension of the circuit board, the support member having holes for allowing the passage of the signal pins, member dissolving with the application of heat.

17. A circuit structure, comprising:
an integrated circuit package;
at least one signal pin;
a circuit board; and
a support member for supporting the at least one signal pin, the at least one signal inn and the support member being disposed between the integrated circuit package and the circuit board, the at least one signal pin electrically and physically interconnecting the circuit board and the integrated circuit package, wherein the at least one signal yin is fluted, and wherein the cap is screwed onto the at least one signal pin.

18. The circuit structure of claim 17, wherein the cap is made of a high dielectric constant material.

19. The circuit structure of claim 18, wherein the support member is a permanent, insulating stanchion that supports the at least one signal pin.

20. The circuit structure of claim 17, wherein the cap is made of conductive material.

21. The circuit structure of claim 20, wherein the integrated circuit package has a recess and the cap adheres to the recess on the integrated circuit package through an adhesive melt.

22. The circuit structure of claim 21, wherein the support member is a permanent, insulating stanchion that supports the at least one signal pin.

23. A circuit structure, comprising:
an integrated circuit package;
at least one signal pin;
a circuit board; and
a support member for supporting the at least one signal pin, the at least one signal pin and the support member being disposed between the integrated circuit package and the circuit board, the at least one signal pin electrically and physically interconnecting the circuit board and the integrated circuit package, wherein the support member is a dissolving type of membrane.

24. The circuit structure of claim 23, wherein the dissolving type of membrane dissolves with the application of heat.

25. The circuit structure of claim 23, wherein the dissolving type of membrane dissolves in water.

26. A circuit structure, comprising:
an integrated circuit package;
a circuit board; and
at least one fluted signal pin being disposed between the integrated circuit package and the circuit board, the at least one fluted signal pin electrically and physically interconnecting the circuit board and the integrated circuit package, the at least one fluted signal pin comprising a cat at one end.

27. The circuit structure of claim 26, wherein the cap is screwed onto the one end of the at least one fluted signal pin.

28. The circuit structure of claim 26, wherein the cap is made of a high dielectric constant material.

* * * * *